(12) United States Patent
Moteki et al.

(10) Patent No.: US 8,288,788 B2
(45) Date of Patent: Oct. 16, 2012

(54) OPTICAL SEMICONDUCTOR DEVICE HAVING UNEVEN SEMICONDUCTOR LAYER WITH NON-UNIFORM CARRIER DENSITY

(75) Inventors: Masahiko Moteki, Kamakura (JP); Yusuke Yokobayashi, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 142 days.

(21) Appl. No.: 12/953,932

(22) Filed: Nov. 24, 2010

(65) Prior Publication Data

US 2011/0121312 A1    May 26, 2011

(30) Foreign Application Priority Data

Nov. 26, 2009 (JP) ................. 2009-268527

(51) Int. Cl.
    *H01L 33/00*       (2010.01)
(52) U.S. Cl. ................. 257/98; 257/E31.127
(58) Field of Classification Search ............. 257/98, 257/E31.127; 438/16, 27, 29, 65, 69
See application file for complete search history.

(56) References Cited

U.S. PATENT DOCUMENTS 6,807,213 B1 * 10/2004 Shimoyama et al. ...... 372/49.01

FOREIGN PATENT DOCUMENTS

| JP | 2006-332383 A | 12/2006 |
| JP | 2007-095744 A | 4/2007 |
| JP | 2008-098336 A | 4/2008 |

* cited by examiner

*Primary Examiner* — Quoc Hoang
(74) *Attorney, Agent, or Firm* — Holtz Holtz Goodman & Chick PC

(57) ABSTRACT

In an optical semiconductor device including a first semiconductor layer of a first conductivity type, an active layer provided on the first semiconductor layer, a second semiconductor layer of a second conductivity type provided on the active layer, an insulating layer provided on a part of the second semiconductor layer, an uneven semiconductor layer of the second conductivity type provided on another part of the second semiconductor layer, and an electrode layer provided on the insulating layer and the uneven semiconductor layer, a density of carriers of the second conductivity type being larger at a tip portion of the uneven semiconductor layer than at a bottom portion of the uneven semiconductor layer.

13 Claims, 13 Drawing Sheets

US 8,288,788 B2

OPTICAL SEMICONDUCTOR DEVICE HAVING UNEVEN SEMICONDUCTOR LAYER WITH NON-UNIFORM CARRIER DENSITY

This application claims the priority benefit under 35 U.S.C. §119 to Japanese Patent Application No. JP2009-268527 filed on Nov. 26, 2009, which disclosure is hereby incorporated in its entirety by reference.

BACKGROUND

1. Field

The presently disclosed subject matter relates to an optical semiconductor device such as alight emitting diode (LED) including III-V group semiconductor compound gallium nitride (GaN).

2. Description of the Related Art

Generally, in an optical semiconductor device including a p-type GaN semiconductor layer, an n-type GaN semiconductor layer and an active semiconductor layer sandwiched by the p-type GaN semiconductor layer and the n-type GaN semiconductor layer, small-incident-angled light emitted from the active semiconductor layer directly or indirectly incident to a light extracting face (upper face) of the semiconductor layers at an incident angle smaller than the critical angle except for its Fresnel component is extracted from the light extracting face. However, large-incident-angled light emitted from the active semiconductor layer directly or indirectly incident to the light extracting face at an incident angle larger than the critical angle is multiply reflected between the light extracting face and its counter face of the semiconductor layers to propagate traversely within the semiconductor layers. Finally, the large-incident-angled light is absorbed by the semiconductor layers, so that the large-incident-angled light cannot be extracted from the light extracting face. Thus, the light extracting efficiency would be decreased.

In order to improve the light extracting efficiency, a first prior art optical semiconductor device is provided with an uneven trapezoidal-sectional structure formed on the counter face of the semiconductor layers (see: JP2006-332383A and JP2007-095744A). The sloped face of the uneven trapezoidal-sectional structure would change the reflection angle of the large-incident-angled light to convert it into small-incident-angled light, thus increasing the ratio of small-incident-angled light to large-incident-angled light. Note that JP2006-332383A relates to a flip-chip (facedown) type optical semiconductor device, while JP2007-095744A relates to a face-up type optical semiconductor device.

Also, in order to improve the light extracting efficiency, a second prior art optical semiconductor device is provided with a silicon oxide layer, a transparent electrode layer and a reflective metal layer formed on the counter face of the semiconductor layers (see: JP2008-98336A). In this case, the silicon oxide layer and the transparent electrode layer totally-reflect the above-mentioned large-incident-angled light toward the inside of the semiconductor layers, and the reflective metal layer reflects the above-mentioned small-incident-angled light transmitted into the silicon oxide layer and the transparent electrode layer toward the inside of the semiconductor layers. The transparent electrode layer also serves to inject currents into the active layer. Note that JP2008-98336A relates to an optical GaAsInP device.

FIG. 10 is a cross-sectional view illustrating a comparative example of the flip-chip type optical semiconductor device which would be obtained by combining the first prior art optical semiconductor device with the second prior art optical semiconductor device.

In FIG. 10, formed on a growing sapphire substrate 1 are an n-type GaN layer 2, an active layer 3 and a p-type GaN layer 4. Also, a silicon oxide layer 5 is formed on the p-type GaN layer 4 to totally reflect large-incident-angled light, and an uneven trapezoidal-sectional p-type GaN layer 6 is formed on a face of the p-type GaN layer 4 where the silicon oxide layer 5 is not formed. The sloped face of the uneven trapezoidal-sectional p-type GaN layer 6 changes the reflection angle of large-incident-angled light to convert it into small-incident-angled light. Further, a transparent electrode layer 7 is formed on the entire face, and a reflective metal layer (p-side electrode layer) 8 is formed on the transparent electrode layer 7 to reflect light transmitted through the silicon oxide layer 5 and the transparent electrode layer 7. Still, an n-side electrode layer 9 is formed on an exposed portion of the n-type GaN layer 2. The transparent electrode layer 7, the reflective metal layer 8 and the n-side electrode layer 9 also serve to inject currents into the active layer 3. Note that the growing sapphire substrate 1 may be removed at a post-stage process, if necessary.

In order to operate the optical semiconductor device of FIG. 10, a drive voltage is applied between the reflective metal layer (p-side electrode layer) 8, i.e., the transparent electrode layer 7 and the n-side electrode layer 9 to inject currents into the active layer 3. In this case, it is assumed that p-type impurities are doped uniformly in the uneven trapezoidal-sectional p-type GaN layer 6. Therefore, the carrier density in the uneven trapezoidal-sectional p-type GaN layer 6 is uniform. As a result, as illustrated in FIG. 11A, currents flow through shortest paths to minimize the electrical resistance thereof. Thus, the currents are concentrated in the roots of the uneven trapezoidal-sectional p-type GaN layer 6. In this case, since the p-type GaN layer 4 is highly electrically-resistant and very thin, the traverse spread of the currents within the p-type GaN layer 4 is so small that the currents flow through only circled parts of the active layer 3 above the roots of the uneven trapezoidal-sectional p-type GaN layer 6. Thus, the current-spreading length L1 of the circled parts of the active layer 3 where electrons and holes are recombined to emit light is so small that the light distribution is non-uniform which degrades the light output characteristics. Also, the drive voltage would be increased, and the reliability would be degraded due to the breakdown of the current-concentrated semiconductor layers 2, 3 and 4.

Note that, as illustrated in FIG. 11B, the spreading length L1 is dependent upon the thickness "g" of the p-type GaN layer 4, not the thickness "h" of the uneven trapezoidal-sectional p-type GaN layer 6. That is, $$L1 \propto g.$$

In FIG. 11B, note that "i" is an interval between portions of the silicon oxide layer 5.

In FIG. 10, in order to relax the current concentration and increase the current-spreading length L1 of the active layer 3 to substantially increase the light emitting region, after the formation of the uneven trapezoidal-sectional p-type GaN layer 6, the silicon oxide layer 5 may be removed to increase the contact area between the transparent electrode layer 7 and the p-type GaN layer 4. In this case, however, a step for removing the silicon oxide layer 5 is necessary which increases the manufacturing cost. On the other hand, since the silicon oxide layer 5 has a smaller index of refraction than those of the other materials of the optical semiconductor device to effectively reflect small-incident-angled light without absorbing it, it is preferable that the silicon oxide layer 5 be left.

SUMMARY

The presently disclosed subject matter seeks to solve one or more of the above-described problems.

According to the presently disclosed subject matter, in an optical semiconductor device including a first semiconductor layer of a first conductivity type, an active layer provided on the first semiconductor layer, a second semiconductor layer of a second conductivity type provided on the active layer, an insulating layer provided on a part of the second semiconductor layer, an uneven semiconductor layer of the second conductivity type provided on another part of the second semiconductor layer, and an electrode layer provided on the insulating layer and the uneven semiconductor layer, a density of carriers of the second conductivity type is larger at a tip portion of the uneven semiconductor layer than at a bottom portion of the uneven semiconductor layer. Thus, due to the decrease of the contact resistance, currents are supplied even from the side and tip portions of the uneven semiconductor layer to the active layer.

According to the presently disclosed subject matter, since currents are supplied even from the side and tip portions of the uneven semiconductor layer, the current-spreading length of the active layer can be increased to improve the light output characteristics. Also, the drive voltage can be decreased. Further, the reliability can be improved by avoiding the breakdown of the semiconductor layers.

BRIEF DESCRIPTION OF THE DRAWINGS

The above and other advantages and features of the presently disclosed subject matter will be more apparent from the following description of certain embodiments, taken in conjunction with the accompanying drawings, wherein.

DETAILED DESCRIPTION OF EXEMPLARY EMBODIMENTS

Figure 1:
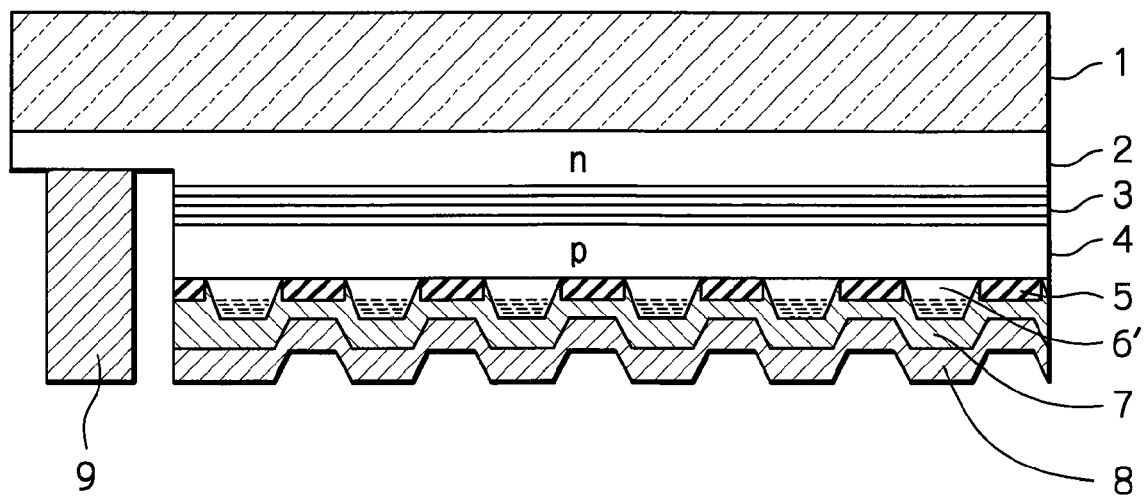
FIG. 1 is a cross-sectional view illustrating a first embodiment of the optical semiconductor device according to the presently disclosed subject matter.
Figure 10:
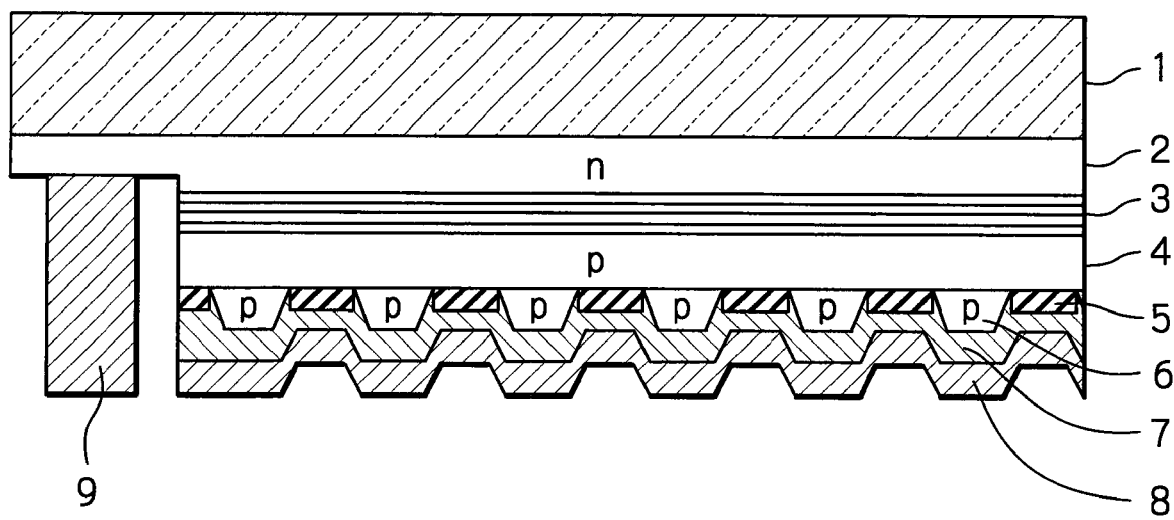
FIG. 10 is a cross-sectional view illustrating a comparative example of the optical semiconductor device.
Figure 11A:
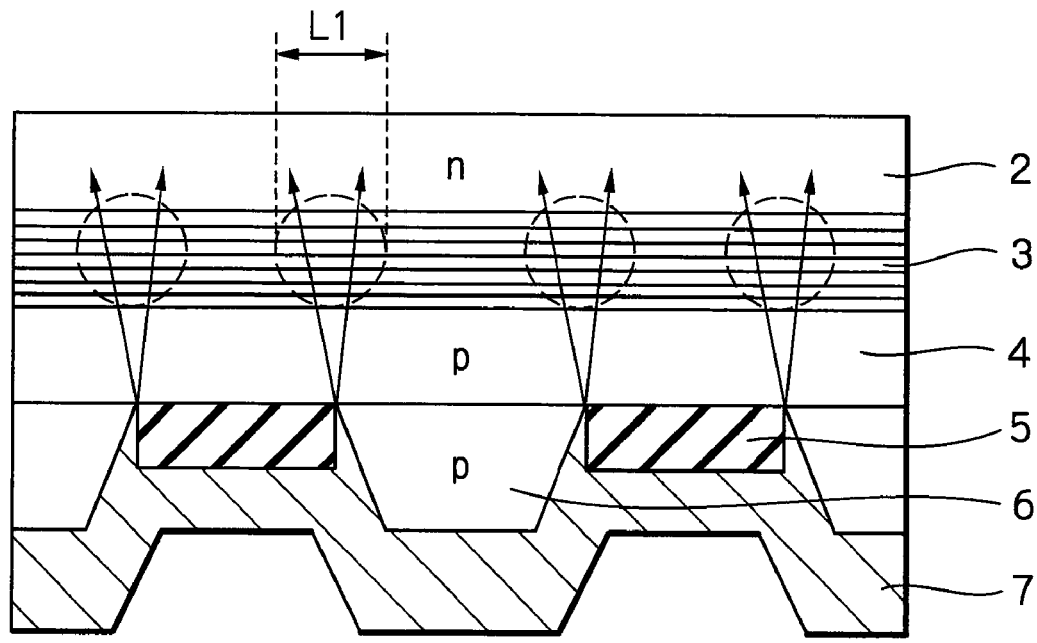
FIGS. 11A and 11B are partly-enlarged cross-sectional views of the optical semiconductor device of FIG. 10.
Figure 11B:
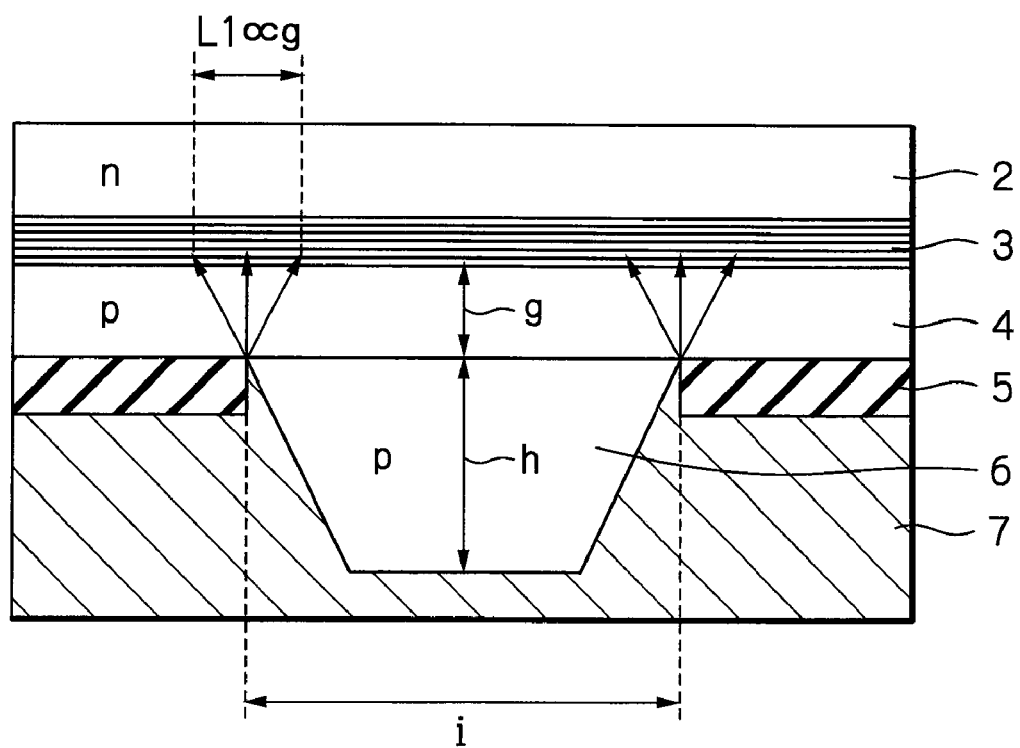

In FIG. 1, which illustrates a first embodiment of the optical semiconductor device according to the presently disclosed subject matter, an uneven trapezoidal-sectional p-type GaN layer 6' which has a non-uniform carrier density is provided instead of the uneven trapezoidal-sectional p-type GaN layer 6 of FIG. 10 which has a uniform carrier density. In the uneven trapezoidal-sectional p-type GaN layer 6', the carrier density is higher at the tip portion of one trapezoidal shape than at the bottom portion thereof. In other words, the concentration of p-type impurities is increased stepwise or continuously from the bottom portion of one trapezoidal shape to the tip portion thereof, and accordingly, the carrier density is increased stepwise or continuously from the bottom portion of one trapezoidal shape to the tip portion thereof.

Figure 2A:
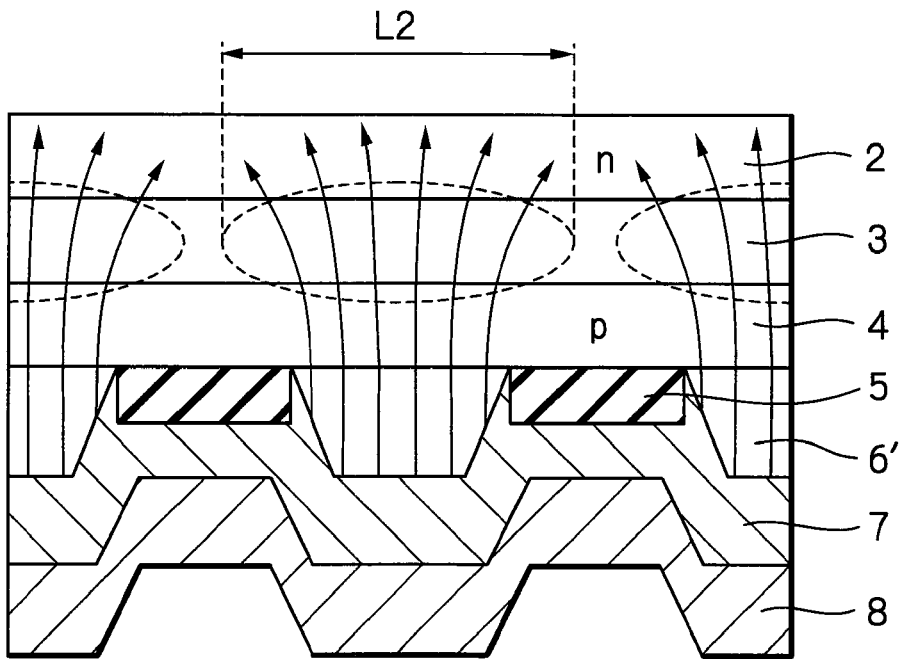
FIGS. 2A and 2B are partly-enlarged cross-sectional views of the optical semiconductor device of FIG. 1.

In order to operate the optical semiconductor device of FIG. 1, a drive voltage is applied between the reflective metal layer (p-side electrode layer) 8, i.e., the transparent electrode layer 7 and the n-side electrode layer 9 to inject currents into the active layer 3. In this case, in the uneven trapezoidal-sectional p-type GaN layer 6', since the carrier density is increased from the bottom portion of one trapezoidal shape to the tip portion thereof, currents are also supplied from the side and tip portion of the uneven trapezoidal-sectional p-type GaN layer 6' to the active layer 3, as illustrated in FIG. 2A, in order to minimize the electrical resistance. As a result, the currents flow through the entire bottom portion of the uneven trapezoidal-sectional p-type GaN layer 6'. Thus, the current-spreading length L2 of the circled parts of the active layer 3 where electrons and holes are recombined to emit light covers the entire bottom portion of the uneven trapezoidal-sectional p-type GaN layer 6' to improve the light output characteristics. Also, the drive voltage would be decreased, and the reliability would be improved by avoiding the breakdown of the current-concentrated semiconductor layers 2, 3 and 4.

Figure 2B:
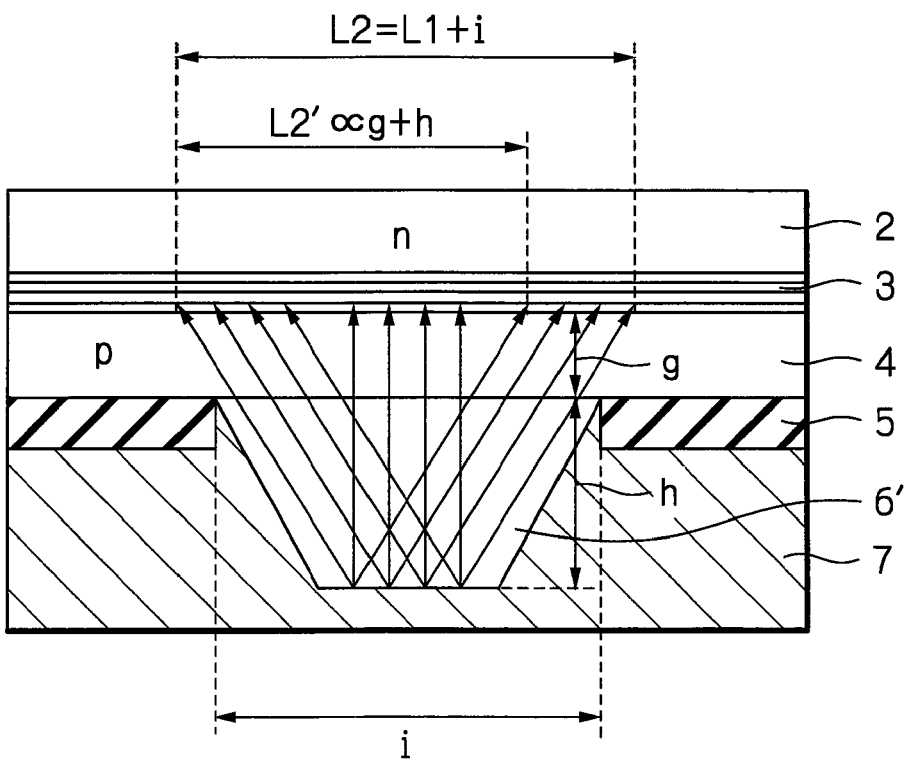

Note that, as illustrated in FIG. 2B, a current-spreading length L2' which is defined from one point of one trapezoidal shape of the uneven trapezoidal-sectional p-type GaN layer 6' is dependent upon the thickness "g" of the p-type GaN layer 4 and the thickness "h" of the uneven trapezoidal-sectional p-type GaN layer 6'. That is, $$L2' \propto g+h.$$

For example, if g=0.1 μm and h=1.2 μm, then $$\begin{aligned} L2'/L1 &= (g+h)/g \\ &= (0.1+1.2)/0.1 \\ &= 13 \end{aligned}$$

Therefore, the current-spreading length L2' is about 13 times the current-spreading length L1 of the comparative example of the optical semiconductor device of FIG. 10. In fact, the actual current-spreading length L2 is defined by the entire bottom portion of the uneven trapezoidal-sectional p-type GaN layer 6', i.e., $$L2=L1+i$$

where "i" is the interval of the silicon oxide layer 5, i.e, the length of the entire bottom portion of the uneven trapezoidal-sectional p-type GaN layer 6'. Therefore, the ratio L2/L1 can be further increased as compared with L2'/L1 to further improve the light output characteristics.

Note that, the uneven trapezoidal-sectional p-type GaN layer 6' can be replaced by an uneven triangular-sectional p-type GaN layer.

A method for manufacturing the optical semiconductor device of FIG. 1 will be explained next with reference to FIGS. 3A through 3H.

Figure 3A:
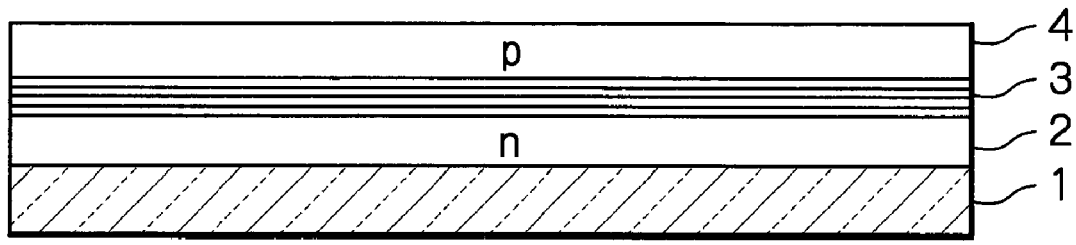
FIGS. 3A through 3H are cross-sectional views for explaining a method for manufacturing the optical semiconductor device of FIG. 1.

First, referring to FIG. 3A, an n-type GaN layer 2, an active layer 3 serving as a light emitting layer and a p-type GaN layer 4 are sequentially and epitaxially grown on a growing C-face sapphire substrate 1 by a metal organic chemical vapor deposition (MOCVD) process.

Concretely, a growing C-face sapphire substrate 1, on which $Al_xIn_yGa_zN$ ($0 \leq x \leq 1, 0 \leq y \leq 1, 0 \leq z \leq 1, x+y+z=1$) can be grown, is put in an MOCVD apparatus to perform a thermal cleaning process upon the growing C-face sapphire substrate 1 in a hydrogen atmosphere at a temperature of about 1000° C. for about 10 minutes.

Then, the growing C-face sapphire substrate 1 is processed by using a mixture gas of trimethyl gallium (TMG) at about 10.4 μmol/min and $NH_3$ at about 3.3 l/min in a normal condition (LM) at a temperature of about 500° C. for about 3 minutes, to grow a low-temperature GaN buffer layer (not shown) on the growing C-face sapphire substrate. Then, an annealing process at a temperature of about 1000° C. for about 30 seconds is performed upon the low-temperature GaN buffer layer to crystallize it. Then, the growing C-face sapphire substrate 1 is again processed by using a mixture gas of TMG at about 45 μmol/min and $NH_3$ at about 4.4 LM at a temperature of about 1000° C. for about 20 minutes, to grow an about 1 μm thick underlayer GaN buffer layer (not shown) on the low-temperature GaN buffer layer. Subsequently, the growing C-face sapphire substrate 1 is further processed by using a mixture gas of TMG at about 45 μmol/min, $NH_3$ at about 4.4 LM and $SiH_4$ at about $2.7 \times 10^{-9}$ μmol/min at a temperature of about 1000° C. for about 120 minutes, to grow an about 7 μm thick n-type GaN layer 2 on the growing C-face sapphire substrate.

Then, an active layer 3 of an InGaN/GaN multiple quantum well (MQW) structure is formed. That is, the growing C-face sapphire substrate 1 is processed by using a mixture gas of TMG at about 3.6 μmol/min, trimethyl indium (TMI) at about 10 μmol/min, and $NH_3$ at about 4.4 LM at a temperature of about 700° C. for about 33 minutes, to grow an about 2.2 nm thick InGaN layer. Subsequently, the growing C-face sapphire substrate 1 is processed by using a mixture gas of TMG at about 3.6 μmol/min, and $NH_3$ at about 4.4 LM at a temperature of about 700° C. for about 320 seconds, to grow an about 15 nm thick GaN barrier layer. In this case, five pairs each including such an InGaN well layer and a GaN barrier layer are repeatedly grown to form the MQW structure on the n-type GaN layer 2.

Note that the active layer 3 can be of a single quantum well (SQW) structure or of a single layer.

Then, the growing C-face sapphire substrate 1 is processed by using a mixture gas of TMG at about 8.1 μmol/min, trimethyl aluminum (TMA) at about 7.5 μmol/min, and $NH_3$ at about 4.4 LM and bis-cyclopentadine magnesium (SP2Mg) at about $2.9 \times 10^{-7}$ μmol/min at a temperature of about 870° C. for about 5 minutes, to grow an about 40 nm thick p-type AlGaN clad layer (not shown) on the active layer 3. Subsequently, the growing C-face sapphire substrate 1 is further processed by using a mixture gas of TMG at about 18 μmol/min, and $NH_3$ at about 4.4 LM and CP2Mg at about $2.9 \times 10^{-7}$ μmol/min at a temperature of about 870° C. for about 7 minutes, to grow an about 15 μm thick p-type GaN layer 4 on the p-type AlGaN clad layer.

Figure 3B:
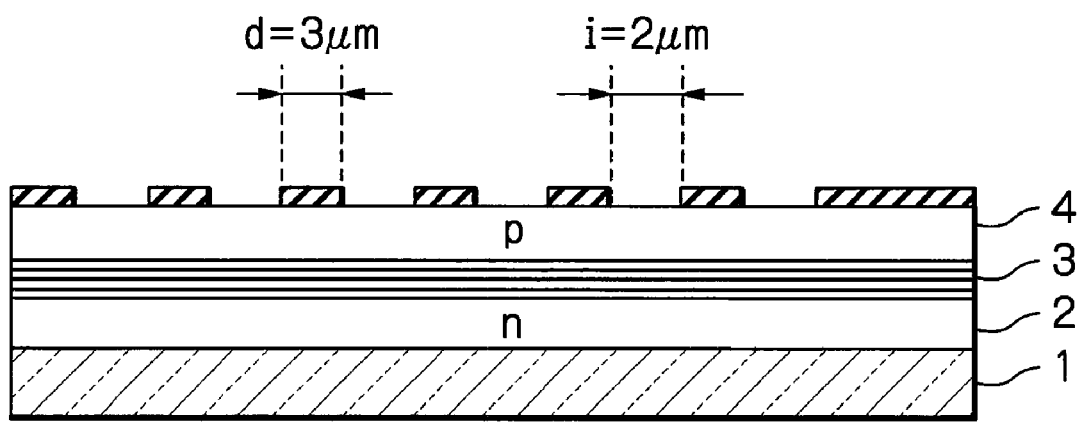

Next, referring to FIG. 3B, a silicon oxide layer is formed on the entire surface, and the silicon oxide layer is patterned by a photolithography and etching process to form a silicon oxide layer 5.

Concretely, the wafer as illustrated in FIG. 3A is transferred from the MOCVD apparatus to a thermal CVD apparatus which carries out a thermal CVD process by introducing a mixture gas of $SH_4$, $O_2$ and $N_2$ at a temperature of about 400° C. to form a silicon oxide layer on the entire surface. Note that an electron beam (EB) evaporation process can be used instead of the thermal CVD process.

Then, the wafer is taken out of the thermal CVD apparatus. Subsequently, the wafer is subject to a photolithography and etching process. That is, a photoresist layer is coated, exposed and developed, and then a wet etching process using fluoric acid is carried out to form the silicon oxide layer 5. In this case, the silicon oxide layer 5 is formed by circular portions whose diameter "d" is about 3 μm and whose interval "i" is about 2 μm to constitute a closest packed arrangement or a triangular lattice arrangement.

Figure 3C:
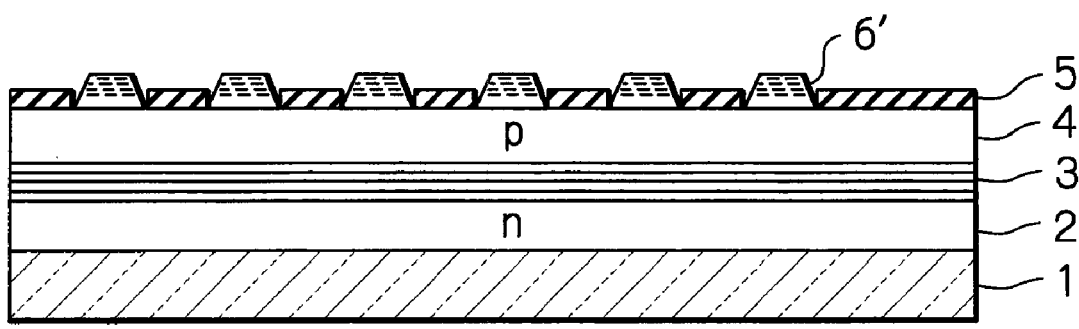

Next, referring to FIG. 3C, an about 1.2 μm thick uneven trapezoidal-sectional p-type GaN layer 6' is formed on parts of the p-type GaN layer 4 where the silicon oxide layer 5 is not formed.

Concretely, the wafer as illustrated in FIG. 3B is again put in the MOCVD apparatus.

Figure 4A:
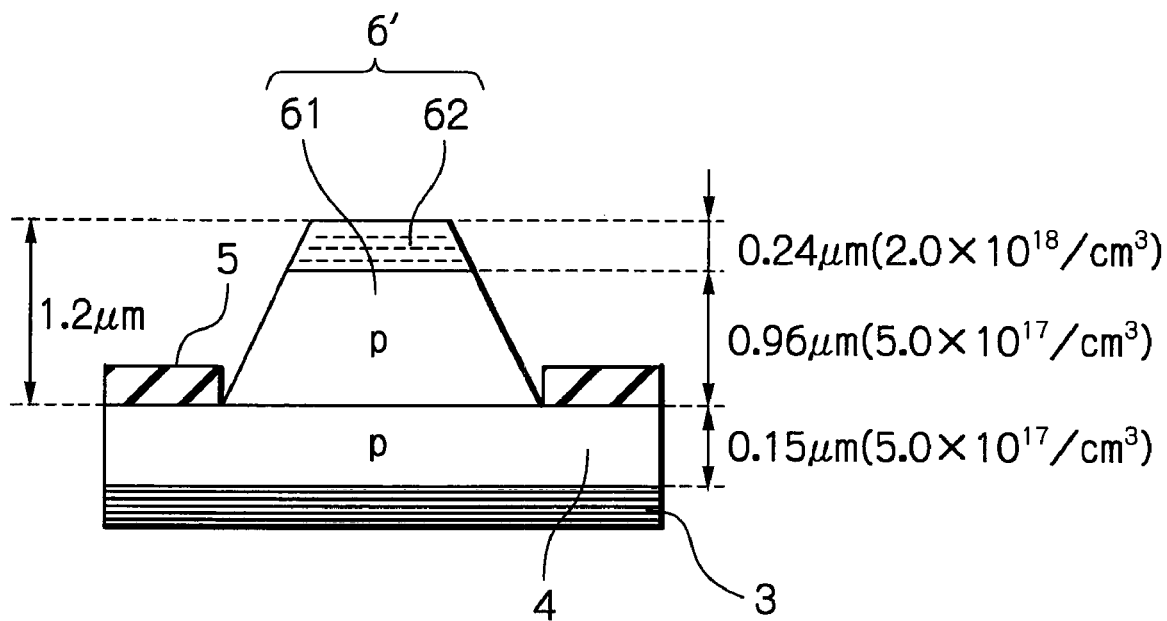
FIGS. 4A and 4B are partly-enlarged cross-sectional views of the uneven trapezoidal-sectional p-type GaN layer of FIG. 3C.

Then, as illustrated in FIG. 4A, which is a partial enlargement of the uneven trapezoidal-sectional p-type GaN layer 6' of FIG. 3C, the growing C-face sapphire substrate 1 is processed by using a mixture gas of TMG at about 18 μmol/min, TMA at about 18 μmol/min, and $NH_3$ at about 4.4 LM and SP2Mg at about $2.9 \times 10^{-7}$ μmol/min at a temperature of about 870° C., to grow an about 0.96 μm thick p-type GaN lower layer 61 whose carrier density is about $5.0 \times 10^{17}/cm^3$ on the p-type GaN layer 4. Subsequently, the growing C-face sapphire substrate 1 is further processed by further increasing only CP2Mg to about $5.0 \times 10^{-7}$ μmol/min to grow an about 0.24 μm thick p-type GaN upper layer 62 whose carrier density is about $2.0 \times 10^{18}/cm^3$ on the p-type GaN lower layer 61.

Thus, the uneven trapezoidal-sectional p-type GaN layer 6' is of a stepwise-double structure formed by the p-type GaN lower layer 61 and the p-type GaN upper layer 62. The carrier density of the latter is about four times that of the former. Note that, the thicker the p-type GaN upper layer 62, the larger the current injected from the sloped face thereof to the active layer 3. However, since the highly-doped p-type GaN upper layer 62 has degraded crystallinity characteristics and dopants Mg with a larger light absorption, it is preferable that the thickness of the p-type GaN upper layer 62 be smaller than half of the uneven trapezoidal-sectional p-type GaN layer 6'.

Figure 4B:
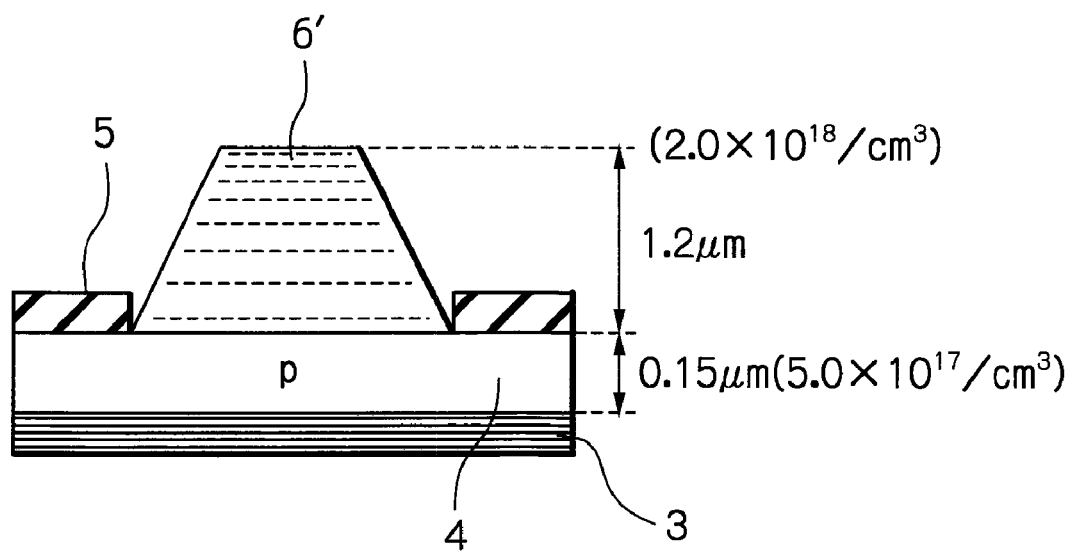

Additionally, as illustrated in FIG. 4B, the uneven trapezoidal-sectional p-type GaN layer 6' can be of a continuously-changed structure. That is, first, the growing C-face sapphire substrate 1 is processed by using a mixture gas of TMG at about 18 μmol/min, TMA at about 18 μmol/min, $NH_3$ at about 4.4 LM and SP2Mg at about $2.9 \times 10^{-7}$ μmol/min at a temperature of about 870° C., to grow an about 0.96 μm thick p-type GaN lower layer whose carrier density is about $5.0 \times 10^{17}/cm^3$ on the p-type GaN layer 4. Subsequently, only CP2Mg is gradually increased to about $5.0 \times 10^{-7}$ μmol/min to grow an about 1.2 μm thick p-type GaN layer 6' on the p-type GaN layer 4. As a result, in the uneven trapezoidal-sectional p-type GaN layer 6' of FIG. 4B, the carrier density at the bottom portion of one trapezoidal shape is the same as about $5.0 \times 10^{17}/cm^3$ of the p-type GaN layer 4, and the carrier density at the tip portion of one trapezoidal shape is the same as about $2.0 \times 10^{17}/cm^3$ of the uneven trapezoidal-sectional p-type GaN layer 6' of FIG. 4A. Thus, larger currents can be injected from the sloped face of the uneven trapezoidal-sectional p-type GaN layer 6' to the active layer 3, to further improve the light output characteristics.

Thus, the carrier density at the tip portion of one trapezoidal shape is about four times or more the carrier density at the bottom portion thereof.

Figure 3D:
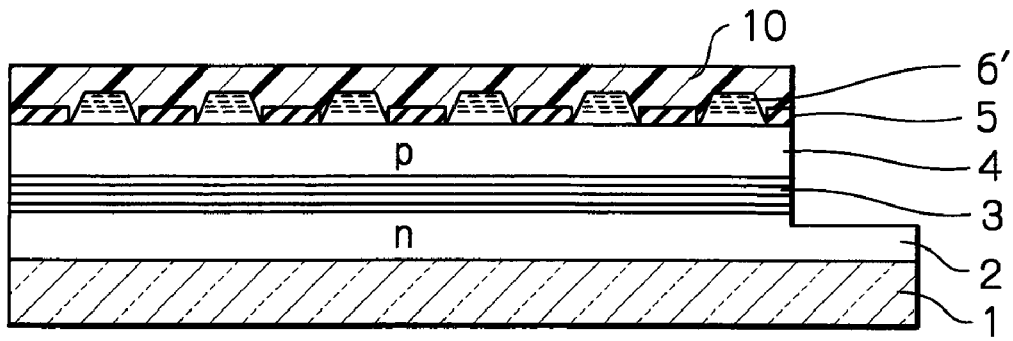

Next, referring to FIG. 3D, a part of the n-type GaN layer 2 is exposed by a photolithography/etching process.

Concretely, a photoresist layer 10 is formed on the entire surface except for a part of the n-type GaN layer 2 to be exposed by a photolithography process. Then, the silicon oxide layer 5 is removed by fluoric acid using the photoresist layer 10 as an etching mask. Then, the wafer is put in a reactive ion etching (RIE) apparatus to remove parts of the uneven trapezoidal-sectional p-type GaN layer 6', the p-type GaN layer 4, the active layer 3 and the n-type GaN layer 2 by an RIE process. Then, the photoresist layer 10 is removed.

Figure 3E:
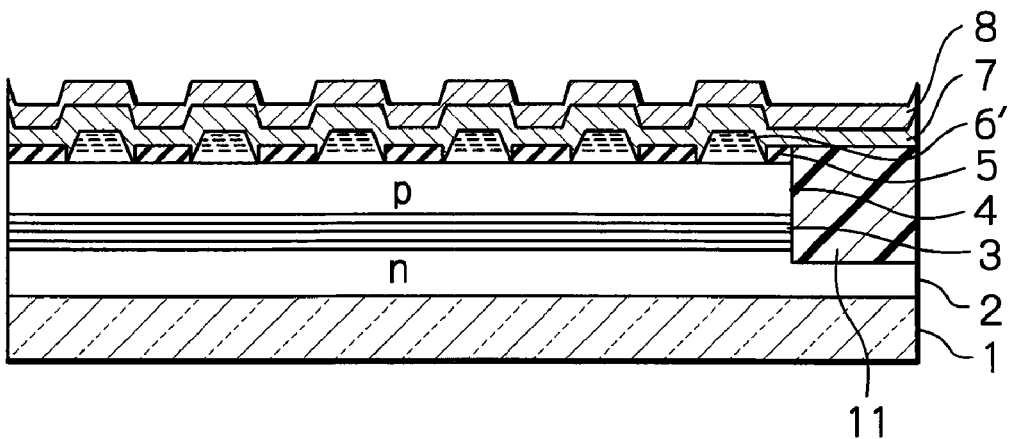

Next, referring to FIG. 3E, a photoresist layer 11 is formed on the exposed part of the n-type GaN layer 2 by a photolithography process, and a transparent electrode layer 7 and a reflective metal layer 8 are formed on the entire surface.

Concretely, a photoresist layer 11 is formed on the exposed part of the n-type GaN layer 2, and an about 110 nm thick transparent electrode layer 7 made of indium tin oxide (ITO). In this case, the index of refraction of the transparent electrode layer 7 is smaller than that of the semiconductor layers 2, 3 and 4, in order to make use of the total reflection phenomenon. In addition, the thickness of the transparent electrode layer 7 is a multiple of the optical wavelength to improve the total reflection phenomenon. Further, the transparent electrode layer 7 can be made of ZnO, SnO or a mixture or solid solution of ITO, ZnO and SnO, in addition to ITO. The transparent electrode layer 7 can be formed by an EB evaporation process, a sputtering process or an arc discharge type ion-plating process; however, the arc discharge type ion-plating process is better than the other processes in view of the quality and damage of the wafers and the fact that the wafer is not directly exposed to plasma.

Then, an about 10 Å thick Ti, an about 3000 Å thick Al, an about 1000 Å thick Ti, an about 1000 Å thick Pt and an about 1 μm thick Au are sequentially grown by an EB evaporation process to form a reflective metal layer 8. The reflective metal layer 8 reflects light that reaches there through an interface between the p-type GaN layer 4 and the silicon oxide layer 5, an interface between the silicon oxide layer 5 and the transparent electrode layer 7, and an interface between the uneven trapezoidal-sectional p-type GaN layer 6' and the reflective metal layer 8, toward the semiconductor layers 2, 3 and 4. The transparent electrode layer 7 can be made of material such as Ag, Pt, Rh, Al, Ir or their combination, which has a high reflectivity against their emitted light whose wavelength is about 450 nm. Also, the reflective metal layer 8 is thicker than about 100 nm so as not to pass the above-mentioned light therethrough. Further, a Ti or Mi layer having a thickness of about several Å can be inserted between the transparent electrode layer 7 and the reflective metal layer 8 to improve their contact characteristics.

Figure 3F:
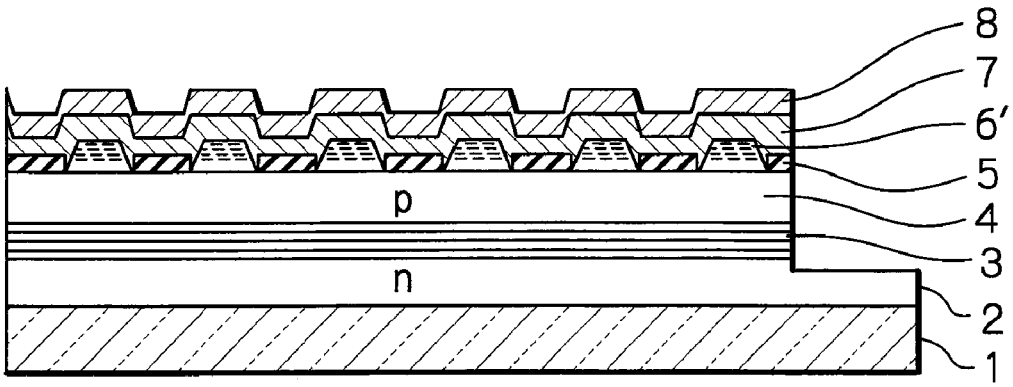

Next, referring to FIG. 3F, the reflective metal layer 8 and the transparent electrode layer 7 are patterned by a lift-off process which removes the photoresist layer 11.

Figure 3G:
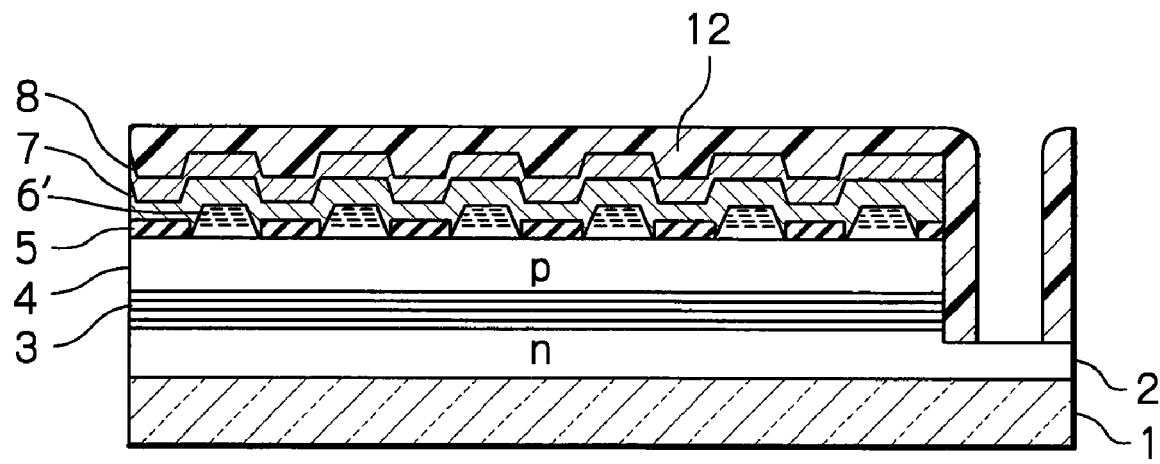

Next, referring to FIG. 3G, a photoresist layer 12 is formed on a part where the n-side electrode layer 9 will be not formed by a photolithography process.

Figure 3H:
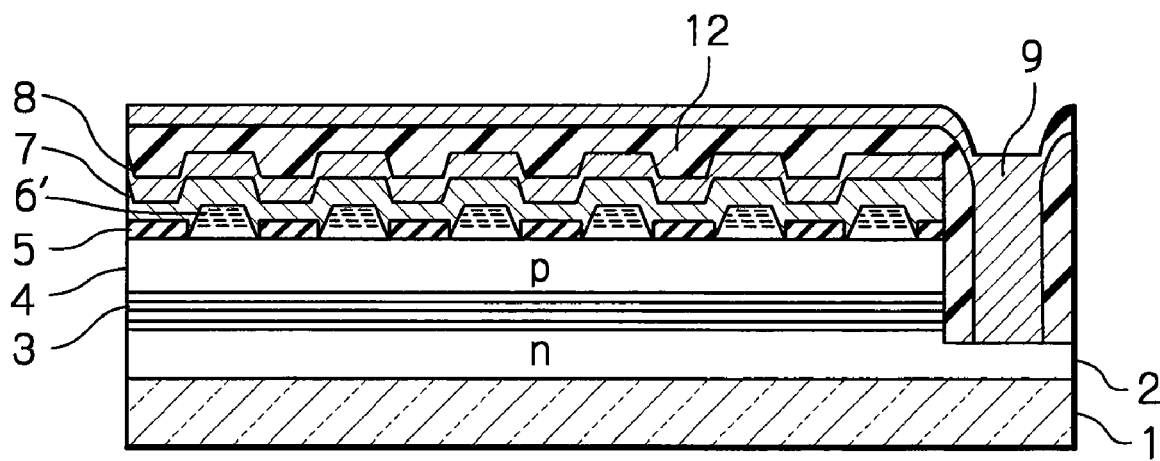

Next, referring to FIG. 3H, an n-side electrode layer 9 is formed on the entire surface.

Concretely, an about 10 Å thick Ti, an about 3000 Å thick Al, an about 1000 Å thick Ti, an about 1000 Å thick Pt and an about 1 μm thick Au are sequentially grown by an EB evaporation process to form an n-side electrode layer 9.

Then, the n-side electrode layer 9 is patterned by a lift-off process which removes the photoresist layer 12, thus obtaining the optical semiconductor device of FIG. 1.

Finally, although not shown, the optical semiconductor devices (chips) on the wafer are separated from each other by a dicing process, a scribing/breaking process or a laser process. After that, the side of the optical semiconductor device where the reflective metal layer 8 and n-side electrode layer 9 are formed is mounted on a printed substrate or a submount by solder, eutectic solder or conductive paste.

A geometrical shape of the uneven trapezoidal-sectional p-type GaN layer 6' is explained below. Here, since the $Al_x In_y Ga_z N$ crystal structure of the semiconductor layers 2, 3 and 4 is hexagonal, the angle between the side face of the uneven trapezoidal-sectional p-type GaN layer 6' and the surface of the semiconductor layers 2, 3 and 4 is about 60°.

Figure 5:
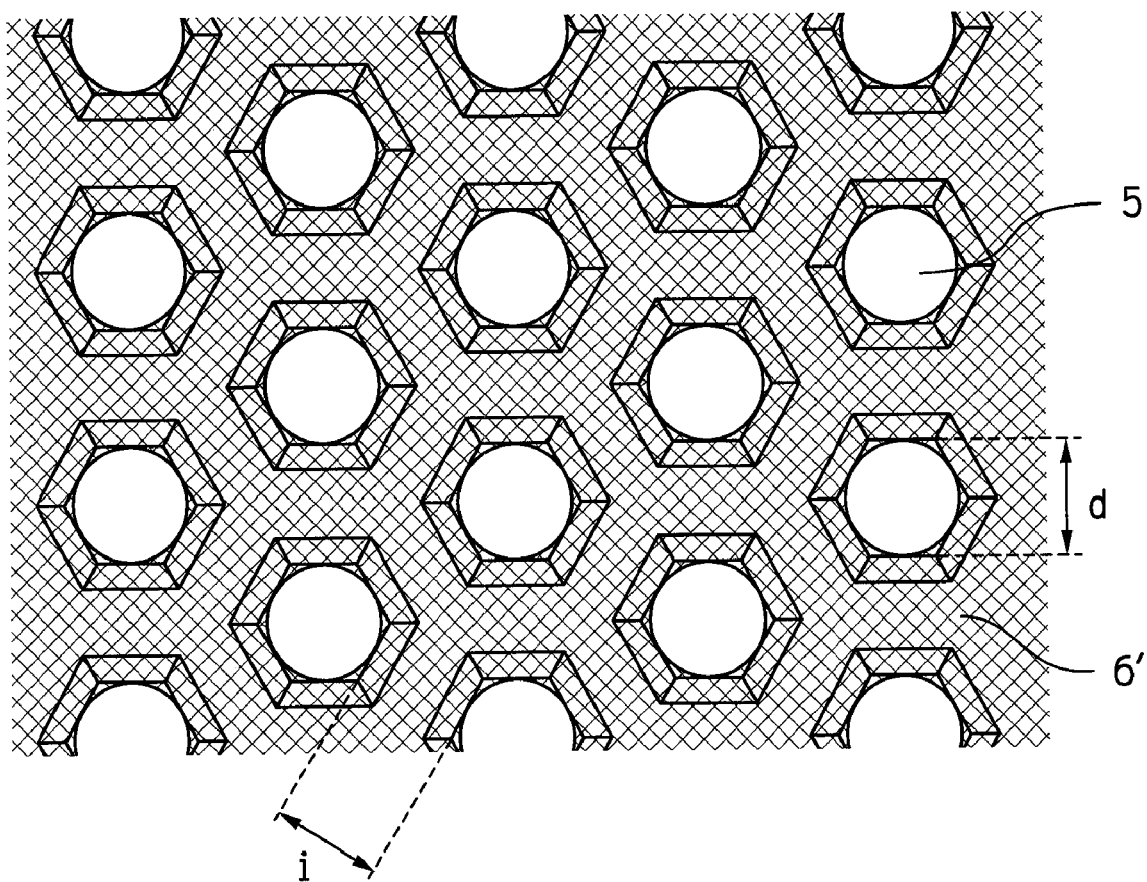
FIG. 5 is a plan view of the silicon oxide layer and the uneven trapezoidal-sectional p-type GaN layer of FIG. 1.

In FIG. 5, which is a plan view of the silicon oxide layer 5 and the uneven trapezoidal-sectional p-type GaN layer 6' of FIG. 1, one circular portion of the silicon oxide layer 5 is arranged in each hexagonal recess of the uneven trapezoidal-sectional p-type GaN layer 6'. In this case, the hexagonal recess of the uneven trapezoidal-sectional p-type GaN layer 6', i.e., the circular portions of the silicon oxide layer 5 are arranged in a closest arrangement or a triangular lattice arrangement. In FIG. 5, shaded portions designate contact areas between the uneven trapezoidal-sectional p-type GaN layer 6' and the transparent electrode layer 7 for generating currents as illustrated by arrows in FIG. 2A and supplying them to the semiconductor layers 6', 4, 3 and 2. Note that, since the uneven trapezoidal-sectional p-type GaN layer 6' is formed by an integral structure, even if the transparent electrode layer 7 is not sufficiently in contact with the reflective metal layer 8, other areas of the uneven trapezoidal-sectional p-type GaN layer 6' not corresponding to non-contact areas between the uneven trapezoidal-sectional p-type GaN layer 6' and the transparent electrode layer 7 generate currents as indicated by arrows in FIG. 2A. Also, the optical semiconductor device having such a structure as illustrated in FIG. 5 can be easily mounted in a flip-chip manner.

Since the silicon oxide layer 5 is present, the contact area between the transparent electrode layer 7 and the semiconductor layers 2, 3 and 4 and 6' as indicated by the shaded portions as in FIG. 5 is decreased to increase the forward voltage of the optical semiconductor device of FIG. 1. Therefore, in order to substantially increase the above-mentioned contact area, the height "h" of the uneven trapezoidal-sectional p-type GaN layer 6' is adjusted to increase the area of the sloped face thereof.

Figure 6A:
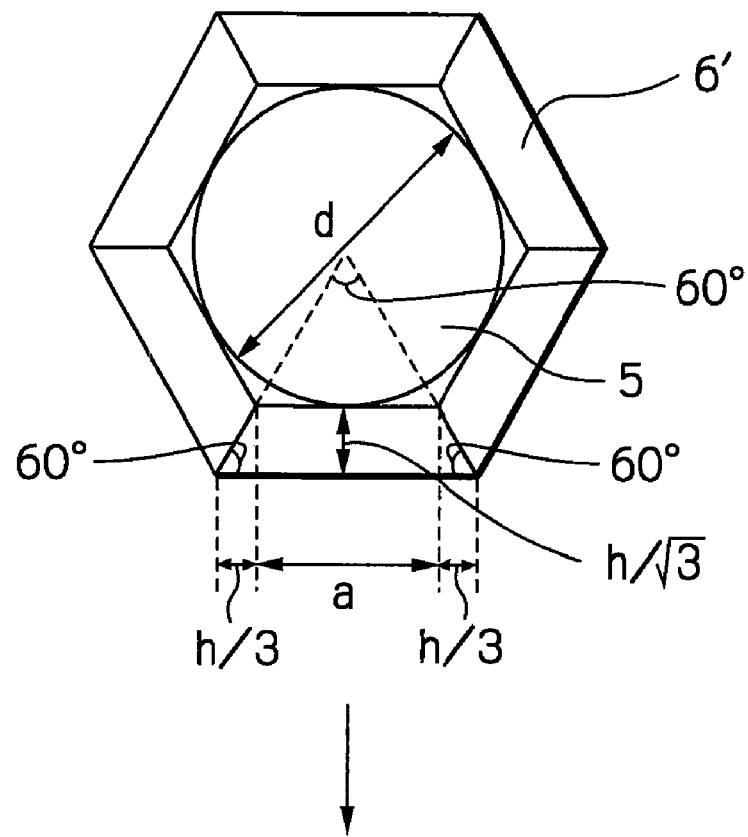
FIG. 6 is a view for explaining the calculation of the hexagonal recess area of FIG. 5.
Figure 6B:
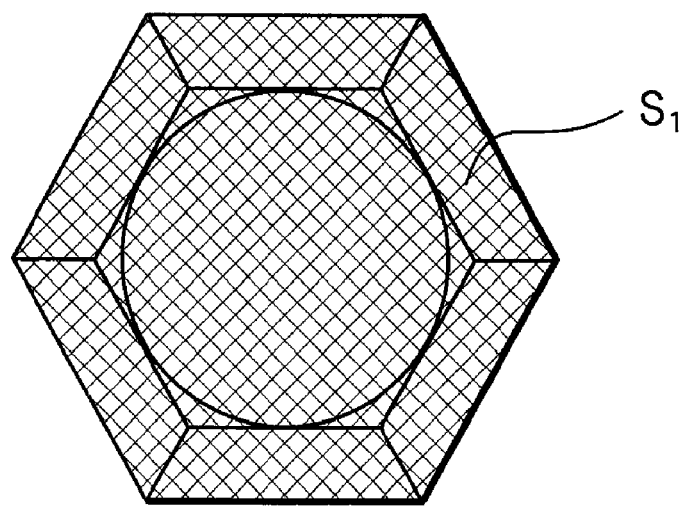

First, a top-viewed area $S_1$ of a hexagonal recess formed by the silicon oxide layer 5 and the uneven trapezoidal-sectional p-type GaN layer 6' is calculated by referring to FIGS. 6A and 6B. In this case, $$S_1 = (3/2)\sqrt{3}(a + 2h/3)^2 \quad (1)$$
$$= (1/2)\sqrt{3}(d + 2h/\sqrt{3})^2$$

where "a" is a length of an inner edge of the hexagonal recess;

"d" is a diameter of the silicon oxide layer 5; and

"h" is a height of the uneven trapezoidal-sectional p-type GaN layer 6'.

Note that the area $S_1$ is a reference value where the silicon oxide layer 5 and the uneven trapezoidal-sectional p-type GaN layer 6' are assumed to be absent so that the transparent electrode layer 7 is in direct contact with the semiconductor layers 4, 3 and 2.

Figure 7A:
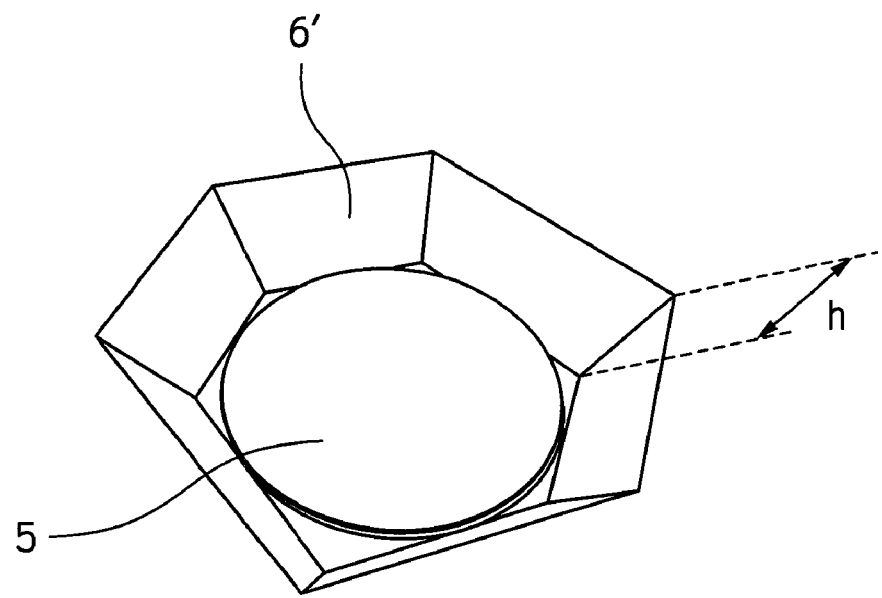
FIG. 7 is a view for explaining the calculation of the area of six sloped portions of the uneven trapezoidal-sectional p-type GaN layer of FIG. 5.
Figure 7B:
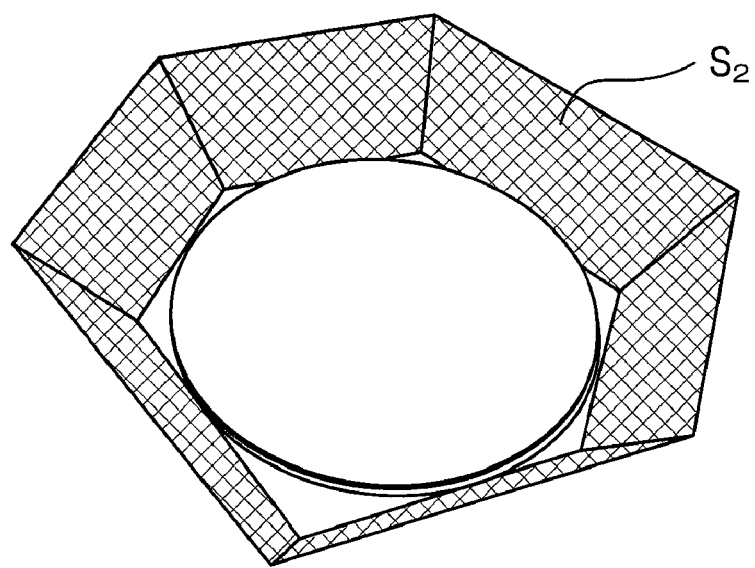

Next, an area $S_2$ of six sloped faces of the uneven trapezoidal-sectional p-type GaN layer 6' is calculated by referring to FIGS. 7A and 7B. In this case, $$S_2 = 4h \cdot \sqrt{3}(a + h/3) \quad (2)$$
$$= 4h(d + h/\sqrt{3})$$

According to the presently disclosed subject matter, the area $S_2$ of six sloped faces of the uneven trapezoidal-sectional p-type GaN layer 6' is set to be not smaller than the top-viewed area $S_1$ of the above-mentioned hexagonal recess, thus assuring the contact area between the transparent electrode layer 7 and the semiconductor layers 4, 3 and 2. That is, $$S_2 \geq S_1$$

$$h \geq (3a/2)(\sqrt{2}-1) \text{ or}$$

$$h \geq (\sqrt{3}d/2)(\sqrt{2}-1) \quad (3)$$

On the other hand, the height "h" of the uneven trapezoidal-sectional p-type GaN layer 6' should not be larger than a lower limit value by which one hexagonal recess is in contact with its adjacent hexagonal recess, i.e., this lower limit value is determined by the interval "i" between the circular portions of the silicon oxide layer 5. As a result, the formula (3) is replaced by $$(3a/2)(\sqrt{2}-1) \leq h \leq 2i/\sqrt{3} \text{ or}$$

$$(\sqrt{3}d/2)(\sqrt{2}-1) \leq h \leq 2i/\sqrt{3} \quad (4)$$

Therefore, $$0.62a \leq h \leq 1.51i \text{ or}$$

$$0.36d \leq h \leq 1.15i \quad (5)$$

As illustrated in FIG. 6A, the angle of one section of the hexagonal recess is 60° depending upon the epitaxially-grown crystal structure of $Al_xIn_yGa_zN$ even if each portion of the silicon oxide layer 5 is polygonal, not circular. Note that, if each portion of the silicon oxide layer 5 is polygonal, "d" is a diagonal length thereof. Therefore, $$a = d/\sqrt{3}$$

Also, the formula (5) is replaced by $$0.36d \leq h \leq 1.15i \quad (6)$$

The smaller the diameter "d" of the silicon oxide layer 5, the closer the uneven trapezoidal-sectional p-type GaN layer 6'. However, if the diameter "d" of the silicon oxide layer 5 is smaller than 10 μm, the above-mentioned uneven structure is non-uniform on the wafer in view of photolithography processes, which decreases the manufacturing yield. On the other hand, if the diameter "d" of the silicon oxide layer 5 is too large, the height "h" of the uneven trapezoidal-sectional p-type GaN layer 6' needs to be larger in view of the formula (6), and also, the plateau area at the tip portion of the uneven trapezoidal-sectional p-type GaN layer 6' serving to reflect light is smaller. In view of these, preferably, $$1.0 \mu m \leq d \leq 4.0 \mu m$$

$$1.5 \mu m \leq i \leq 3.0 \mu m$$

Therefore, when the inventors set d=3 μm and i=2 μm, from the formula (6), $$0.93 \mu m \leq h \leq 2.3 \mu m \quad (7)$$

Further, when the inventors set h=1.2 μm, as compared with an optical semiconductor device with a plate transparent electrode layer and a plate reflective metal layer, the light output under a drive current of 20 mA was improved by about 14 percent (=8.03 mW/7.00 mW), while the forward voltage was about the same (about 4.0V).

Figure 8:
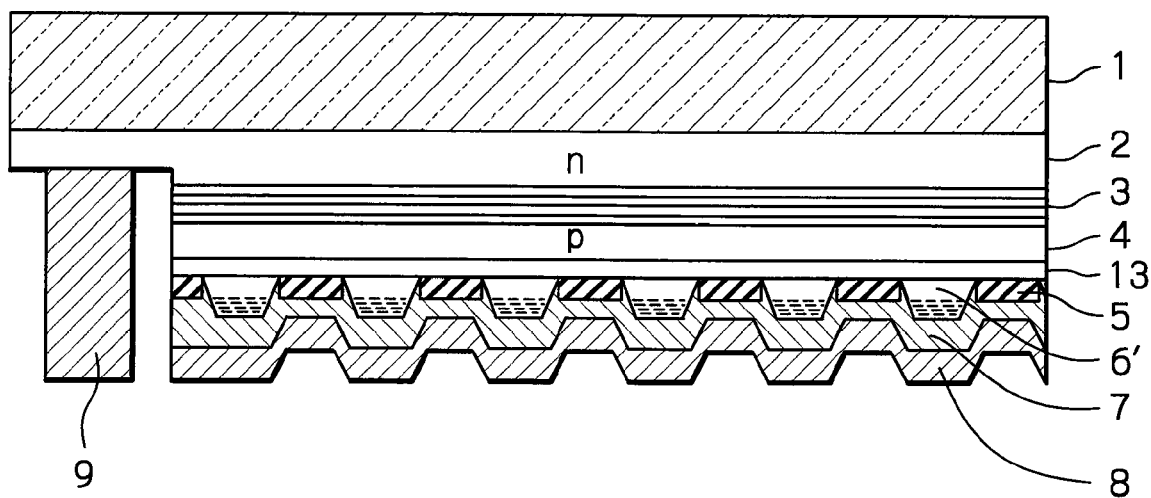
FIG. 8 is a cross-sectional view illustrating a modification of the optical semiconductor device of FIG. 1.

In FIG. 8, which is a modification of the optical semiconductor device of FIG. 1, a tunnel layer 13 is inserted between the p-type GaN layer 4, and the silicon oxide layer 5 and the uneven trapezoidal-sectional p-type GaN layer 6' of FIG. 1.

The tunnel layer 13 is insulating or is made of n-type GaN, and its thickness is about 10 to 50 Å to exhibit the tunnel effect. Thus, the current-spreading length L2 of the uneven trapezoidal-sectional p-type GaN layer 6' of FIGS. 2A and 2B can be further increased, to thereby further improve the light output characteristics.

Figure 9:
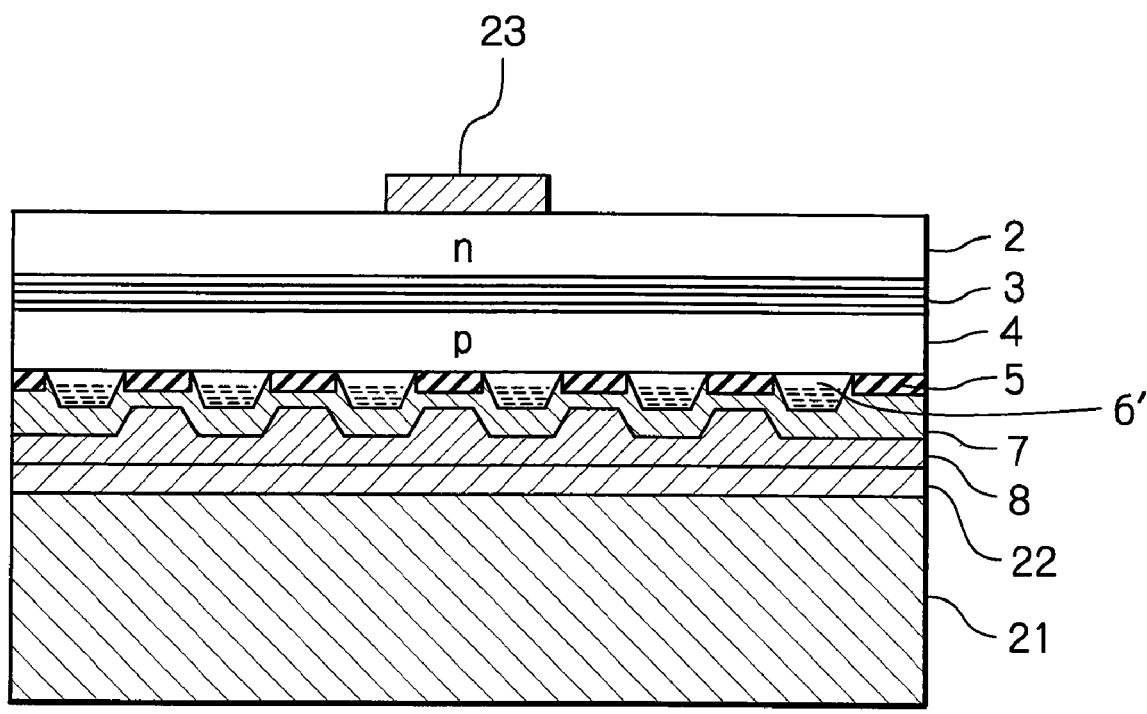
FIG. 9 is a cross-sectional view illustrating a second embodiment of the optical semiconductor device according to the presently disclosed subject matter.

In FIG. 9, which is a cross-sectional view illustrating a second embodiment of the optical semiconductor device according to the presently disclosed subject matter, an upper/lower electrode type (vertical type) optical semiconductor device is illustrated. That is, the growing sapphire substrate 1 of FIG. 1 is removed. Also, a conductive support body 21 having good thermal conductivity is adhered by an adhesive layer 22 to the reflective metal layer 8. Further, an n-side electrode layer 23 instead of the n-side electrode layer 9 of FIG. 1 is provided on the n-type GaN layer 2.

In order to operate the optical semiconductor device of FIG. 9, in the same way as in the optical semiconductor device of FIG. 1, a drive voltage is applied between the reflective metal layer (p-side electrode layer) 8, i.e., the transparent electrode layer 7 via the conductive support body 21 and the n-side electrode layer 23 to inject currents into the active layer 3. In this case, in the uneven trapezoidal-sectional p-type GaN layer 6', since the carrier density is increased from the bottom portion of one trapezoidal shape to the tip portion thereof, currents are also supplied from the side and tip portions of the uneven trapezoidal-sectional p-type GaN layer 6' to the active layer 3, in order to minimize the electrical resistance. As a result, the currents flow through the entire bottom portion of the uneven trapezoidal-sectional p-type GaN layer 6'. Thus, the current-spreading length L2 of the active layer 3 where electrons and holes are recombined to emit light covers the entire bottom portion of the uneven trapezoidal-sectional p-type GaN layer 6' to improve the light output characteristics. Also, the drive voltage would be decreased, and the reliability would be improved by avoiding the breakdown of the current-concentrated semiconductor layers 2, 3 and 4.

A method for manufacturing the optical semiconductor device of FIG. 9 will be briefly explained next.

In the same way as in FIGS. 3A to 3E, an n-type GaN layer 2, an active layer 3, a p-type GaN layer 4, a silicon oxide layer 5, an uneven trapezoidal-sectional p-type GaN layer 6', a transparent electrode layer 7 and a reflective metal layer 8 are sequentially formed on a growing C-face sapphire substrate 1. Note that the photoresist layers 10 and 11 of FIGS. 3D and 3E are not formed.

Next, a conductive support body 21 made of impurity-doped silicon (Si), germanium (Ge), copper (Cu) or copper alloy is prepared. Then, adhesive layers (not shown) are grown on the reflective metal layer 8 and/or the conductive support body 21 by an EB evaporation process or the like.

Next, the conductive support body 21 is bonded by a thermal pressuring process to the reflective metal layer 8 on the wafer side, so that an adhesive layer 22 made of AuSn eutectic is formed between the wafer and the conductive support body 21.

Next, the growing C-face sapphire substrate 1 is removed by a lift-off process. That is, the growing C-face sapphire substrate 1 is irradiated with a laser to dissolve GaN at an interface between the growing C-face sapphire substrate 1 and the p-type GaN layer 4 into Ga metal and nitrogen ($N_2$) gas, thus removing the growing C-face sapphire substrate 1 to expose the n-type GaN layer 2.

Next, an about 10 Å thick Ti, an about 3000 Å thick Al, an about 1000 Å thick Ti, an about 1000 Å thick Pt and an about 1 μm thick Au are sequentially grown by an EB evaporation process to form an n-side electrode layer 23 on the n-type GaN layer 2.

Then, the n-side electrode layer 23 is patterned by a photolithography/etching process, thus obtaining the optical semiconductor device of FIG. 10.

Finally, although not shown, the optical semiconductor devices (chips) on the wafer are separated from each other by a dicing process, a scribing/breaking process or a laser process. After that, the side of the optical semiconductor device where the reflective metal layer 8 and n-side electrode layer 9 are formed is mounted on a printed substrate or a submount by solder, eutectic solder or conductive paste.

In the above-described embodiments, note that the uneven trapezoidal-sectional p-type GaN layer 6' can be an uneven triangular-sectional p-type GaN layer.

The present invention can also be applied to other semiconductor materials such as AlGaAs or AlGaInP than GaN.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

What is claimed is:

1. An optical semiconductor device comprising:
   a first semiconductor layer of a first conductivity type;
   an active layer provided on said first semiconductor layer;
   a second semiconductor layer of a second conductivity type provided on said active layer;
   an insulating layer provided on apart of said second semiconductor layer;
   an uneven semiconductor layer of said second conductivity type provided on another part of said second semiconductor layer; and
   an electrode layer provided on said insulating layer and said uneven semiconductor layer,
   a density of carriers of said second conductivity type being larger at a tip portion of said uneven semiconductor layer than at a bottom portion of said uneven semiconductor layer.

2. The optical semiconductor device as set forth in claim 1, wherein the density of said carriers at the tip portion of said uneven semiconductor layer is about four times or more the density of said carriers at the bottom portion of said uneven semiconductor layer.

3. The optical semiconductor device as set forth in claim 1, wherein the density of said carriers is increased stepwise from the bottom portion of said uneven semiconductor layer to the tip portion thereof.

4. The optical semiconductor device as set forth in claim 1, wherein the density of said carriers is increased continuously from the bottom portion of said uneven semiconductor layer to the tip portion thereof.

5. The optical semiconductor device as set forth in claim 1, wherein said uneven semiconductor layer is trapezoidal-sectional.

6. The optical semiconductor device as set forth in claim 1, wherein said uneven semiconductor layer is triangular-sectional.

7. The optical semiconductor device as set forth in claim 1, wherein said first semiconductor layer, said active layer, said second semiconductor layer and said uneven semiconductor layer comprises III-V group nitride represented by $Al_x In_y Ga_z N$ where $0 \leq x \leq 1$, $0 \leq y \leq 1$, $0 \leq z \leq 1$ and $x+y+z=1$.

8. The optical semiconductor device as set forth in claim 1, wherein an index of refraction of said insulating layer is smaller than those of said first semiconductor layer, active layer and said second semiconductor layer.

9. The optical semiconductor device as set forth in claim 1, wherein said insulating layer comprises a plurality of portions, and said uneven semiconductor layer surrounds the portions of said insulating layer.

10. The optical semiconductor device as set forth in claim 9, wherein the portions of said insulating layer are circular.

11. The optical semiconductor device as set forth in claim 9, wherein the portions of said insulating layer are polygonal.

12. The optical semiconductor device as set forth in claim 9, wherein the portions of said insulating layer are arranged in a triangular lattice manner.

13. The optical semiconductor device as set forth in claim 12, wherein said uneven semiconductor layer has a thickness "h" represented by $$0.36d \leq h \leq 1.15i$$

$$1.0 \mu m \leq d \leq 4.0 \mu m$$

$$1.5 \mu m \leq i \leq 3.0 \mu m$$

where "d" is a diameter or diagonal length of the portions of said insulating layer; and
"i" is an interval between the portions of said insulating layer.

* * * * *